(12) United States Patent
Ko et al.

(10) Patent No.: US 11,124,860 B2
(45) Date of Patent: Sep. 21, 2021

(54) COMPOUND SEMICONDUCTOR AND USE THEREOF

(71) Applicant: LG CHEM, LTD., Seoul (KR)

(72) Inventors: Kyung Moon Ko, Daejeon (KR); Min Kyoung Kim, Daejeon (KR); Cheol Hee Park, Daejeon (KR); Chee Sung Park, Daejeon (KR); Myung Jin Jung, Daejeon (KR); Yu Ho Min, Daejeon (KR)

(73) Assignee: LG CHEM, LTD., Seoul (KR)

( * ) Notice: Subject to any disclaimer, the term of this patent is extended or adjusted under 35 U.S.C. 154(b) by 538 days.

(21) Appl. No.: 16/082,028

(22) PCT Filed: Dec. 22, 2017

(86) PCT No.: PCT/KR2017/015376
§ 371 (c)(1),
(2) Date: Sep. 4, 2018

(87) PCT Pub. No.: WO2018/169173
PCT Pub. Date: Sep. 20, 2018

(65) Prior Publication Data
US 2020/0283873 A1    Sep. 10, 2020

(30) Foreign Application Priority Data

Mar. 15, 2017  (KR) ........................ 10-2017-0032642

(51) Int. Cl.
*C22C 12/00*  (2006.01)
*C22C 1/04*  (2006.01)
(Continued)

(52) U.S. Cl.
CPC ................ *C22C 12/00* (2013.01); *C22C 1/04* (2013.01); *H01L 31/032* (2013.01); *H01L 35/16* (2013.01)

(58) Field of Classification Search
CPC ......... H01L 35/16; H01L 35/18; H01L 35/34; H01L 31/0272; C01B 19/002; C01G 51/00; C01G 51/006
See application file for complete search history.

(56) References Cited

U.S. PATENT DOCUMENTS 6,369,314 B1  4/2002  Nolas
6,444,894 B1  9/2002  Sterzel
(Continued)

FOREIGN PATENT DOCUMENTS

CN   102709461 A   10/2012
CN   103811653 B   1/2017
(Continued)

OTHER PUBLICATIONS

Graff et al., "Exceeding the filling fraction limit in CoSb3 skutterudite", J. Mate. Chem, A, 2014 (Year: 2014).*
(Continued)

*Primary Examiner* — Matthew T Martin
(74) *Attorney, Agent, or Firm* — Birch, Stewart, Kolasch & Birch, LLP

(57) ABSTRACT

The present invention provides a novel compound semiconductor that has improved thermoelectric figure of merit as well as excellent electric conductivity, and thus, can be applied for various uses such as thermoelectric conversion material of a thermoelectric conversion device, a solar battery, and the like, and a method for preparing the same.

12 Claims, 2 Drawing Sheets

(51) Int. Cl.
*H01L 31/032* (2006.01)
*H01L 35/16* (2006.01)

(56) References Cited

U.S. PATENT DOCUMENTS

| | | | |
|---|---|---|---|
| 7,723,607 | B2 | 5/2010 | Subramanian et al. |
| 7,728,218 | B2 | 6/2010 | Snyder et al. |
| 8,603,368 | B2 | 12/2013 | Park et al. |
| 8,679,374 | B2 | 3/2014 | Park et al. |
| 8,747,704 | B2 | 6/2014 | Park et al. |
| 9,711,396 | B2 | 7/2017 | Tang et al. |
| 2016/0276564 | A1 | 9/2016 | Nie et al. |
| 2018/0145238 | A1* | 5/2018 | Tanaka .................. H01L 35/34 |

FOREIGN PATENT DOCUMENTS

| | | |
|---|---|---|
| JP | 2001-223392 A | 8/2001 |
| JP | 2002-26400 A | 1/2002 |
| JP | 2007-258200 A | 10/2007 |
| JP | 2014-509292 A | 4/2014 |
| JP | 2016-178176 A | 10/2016 |
| KR | 10-2012-0070124 A | 6/2012 |
| KR | 10-2012-0127322 A | 11/2012 |
| KR | 10-2012-0137400 A | 12/2012 |
| KR | 10-2012-0140452 A | 12/2012 |
| KR | 10-1366710 B1 | 2/2014 |
| KR | 10-2016-0148483 A | 12/2016 |
| WO | WO 2012/157904 A1 | 11/2012 |

OTHER PUBLICATIONS

Duan et al., "Electronegative Guests in CoSb3", Energy Environ. Sci. 2016. (Year: 2016).*
Scherrer "Solar thermoelectric generator based on skutterudites", Journal of Power Sources, 2003. (Year: 2003).*
Rull Bravo et al., "Skutterudites as thermoelectric materials", RSC Adv. 2015 (Year: 2015).*
Dong et al., "Structure and thermoelectric properties of Se- and Se/Te-doped $CoSb_3$ skutterudites synthesized by high-pressure technique", Journal of Alloys and Compounds 2015, vol. 647, pp. 295-302.
Duan et al., "Electronegative Guests in $CoSb_3$", Energy & Environmental Science, 2016, 9, 2090-2098, Total 29 Pages.
Duan et al., "Enhanced thermoelectric performance in sulfur-doped $Co_4Sb_{11.9-x}Te_xS_{0.1}$ skutterudites", Materials Letters, 2012, vol. 79, pp. 69-71.
Graff et al., "Exceeding the filling fraction limit in $CoSb_3$ skutterudite: multi-role chemistry of praseodymium leading to promising thermoelectric performance", Journal of Materials Chemistry A, 2014, vol. 2, No. 23, pp. 8933-8940.
Li et al., "$Er^{3+}$ doped and $Er^{3+}/Pr^{3+}$ co-doped gallium-antimony-sulphur chalcogenide glasses for infrared applications", Optical Materials Express, Dec. 1, 2016, vol. 6, No. 12, pp. 3849-3856.
Maple et al., "Strongly correlated electron phenomena in Pr-based filled skutterudite compounds", Journal of Magnetism and Magnetic Materials, 2007, vol. 310, No. 2, pp. 182-187.

* cited by examiner

[FIG. 1]
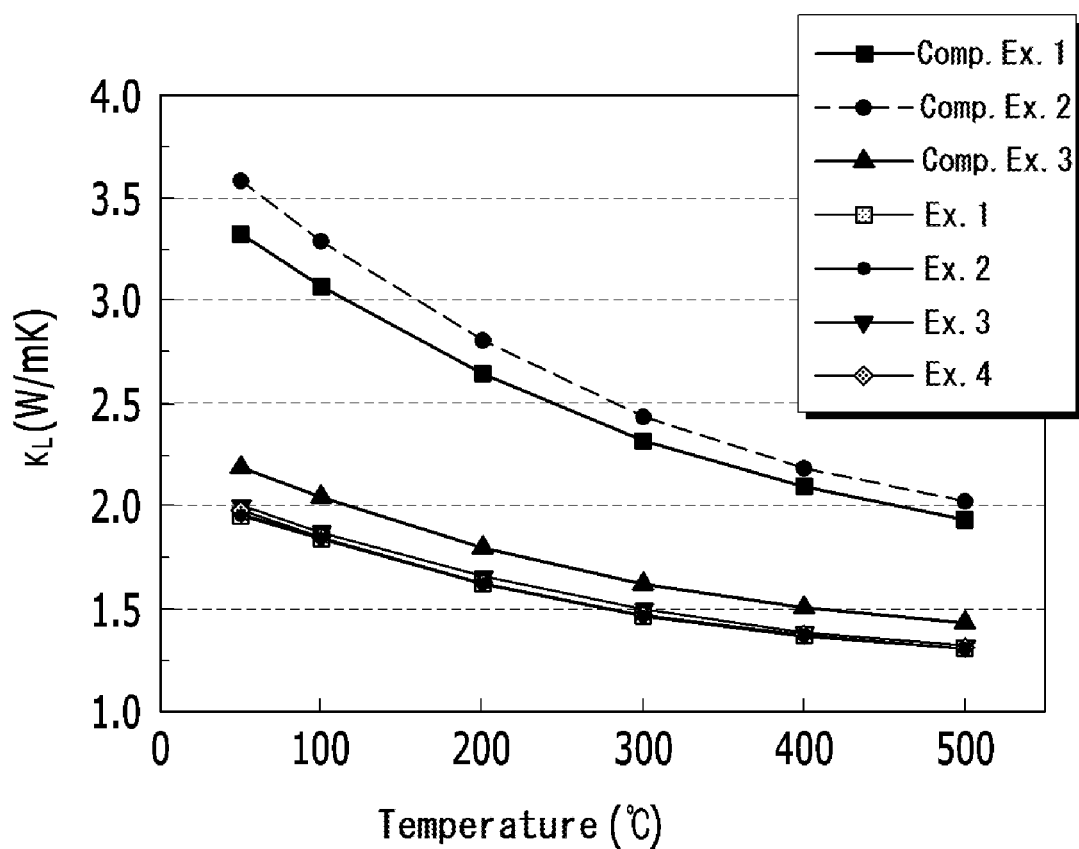

[FIG. 2]
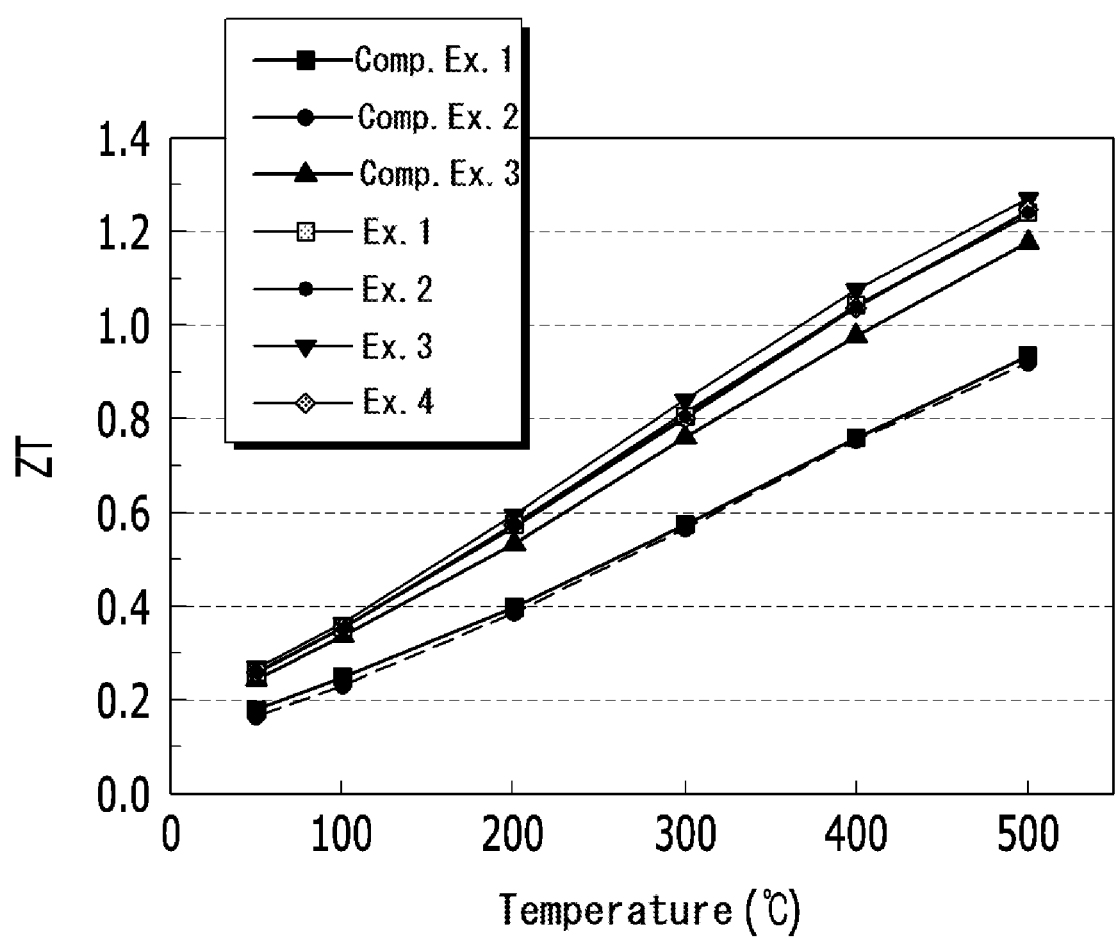

COMPOUND SEMICONDUCTOR AND USE THEREOF

CROSS-REFERENCE TO RELATED APPLICATION

This application claims the benefit of Korean Patent Application No. 10-2017-0032642 filed on Mar. 15, 2017 with the Korean Intellectual Property Office, the disclosures of which are herein incorporated by reference in their entirety.

TECHNICAL FIELD

The present invention relates to a novel compound semiconductor that has improved thermoelectric figure of merit as well as excellent electric conductivity, and thus, can be applied for various uses such as thermoelectric conversion material of a thermoelectric conversion device, a solar battery, and the like, a method for preparing the same, and the use thereof.

BACKGROUND OF ART

A compound semiconductor is a compound acting as a semiconductor wherein two or more kinds of elements are bonded instead of a single element such as silicon or germanium. Currently, various kinds of the compound semiconductors have been developed and are being used in various fields. Representatively, the compound semiconductor may be used for a thermoelectric conversion device using Peltier Effect, a light emitting device such as a light emitting diode or a laser diode, etc. using photoelectric conversion effect, or a solar battery, etc.

Among them, the thermoelectric conversion device may be applied for thermoelectric generation or thermoelectric cooling, etc., and the thermoelectric generation is the form of power generation that converts heat energy into electric energy using thermoelectromotive force generated by making a temperature difference in a thermoelectric conversion device. The energy conversion efficiency of the thermoelectric conversion device depends on the figure of merit of the thermoelectric conversion material (ZT). Here, ZT is determined according to Seebeck coefficient, electric conductivity and thermal conductivity, etc., and more specifically, it is proportional to the square of Seebeck coefficient and electric conductivity, and is inversely proportional to thermal conductivity. Thus, in order to increase the energy conversion efficiency of the thermoelectric conversion device, the development of thermoelectric conversion material having high Seebeck coefficient or electric conductivity or low thermal conductivity is required.

Binary skutterudite having a unit lattice crystallographically pertaining to cubic space group Im3 is known as a material fulfilling the requirement for high ZT value. The structure of skutterudite includes 32 atoms of 8 TX3 groups in the unit lattice, and besides, it has relatively large unit lattice, thus capable of improving thermoelectric properties due to decrease in lattice thermal conductivity. Wherein T is a transition element, occupied by elements such as Co, Rh, Ir, etc., and X is a nicogen element, occupied by P, As, Sb elements.

However, binary skutterudite exhibits low efficiency thermoelectric properties due to relatively high lattice thermal conductivity. In order improve this, a method of filling rattler atoms in two voids existing in the unit lattice as filler to induce rattling effect, thereby decreasing lattice thermal conductivity, or a method of substituting a part of the elements with doping elements to form band engineering, mass fluctuation, etc., and induce carrier concentration control and lattice scattering, thereby improving thermoelectric figure of merit, etc. are being studied.

Although various fillers influencing a decrease in the thermal conductivity of material have been suggested, rattler atoms exhibiting excellent thermoelectric properties are very expensive, and they are vulnerable to oxidation, and thus, process cost is added, and thermoelectric material using the same is unstable at high temperature, thus deteriorating the durability of a thermoelectric power generation module.

Thus, there is a need for the development of skutterudite that can maintain stable and high ZT value at high temperature, by adding novel rattler atom capable of lowering the content of rattler atom to reduce cost, and simultaneously, compensate the above problem.

Meanwhile, since a solar battery is environmentally friendly in that a separate energy source is not required in addition to sunlight existing in nature, it is being actively studied as a future replacement energy source. A solar battery may be divided into a silicon solar battery mainly using a single element of silicon, a compound semiconductor solar battery using a compound semiconductor, and a tandem solar battery wherein two or more solar batteries having different band gap energy are stacked, etc.

Among them, the compound semiconductor solar battery uses a compound semiconductor in a photo absorbing layer that absorbs sunlight to form an electron-hole pair, and particularly, —V group compound semiconductor such as GaAs, InP, GaAlAs, GaInAs, etc., —VI group compound semiconductor such as CdS, CdTe, ZnS, etc., and —III—group compound semiconductor represented by CuInSe2, etc. may be used.

The photo absorbing layer of a solar battery is required to have excellent long term electrical optical stability, have high photoelectric conversion efficiency, and be easy to control the band gap energy or conductive type by composition change or doping, etc. And, for commercialization, the requirements such as manufacturing cost or yield, etc. should be satisfied. However, many existing compound semiconductors fail to simultaneously satisfy such requirements.

DETAILED DESCRIPTION OF THE INVENTION

Technical Problem

It is an object of the present invention to provide a novel compound semiconductor that has improved thermoelectric figure of merit as well as excellent electric conductivity, and thus, can be applied for various uses such as thermoelectric conversion material of a thermoelectric conversion device, photo absorbing layer material of a solar battery, and the like, and a method for preparing the same.

It is another object of the present invention to provide a thermoelectric conversion device or a solar battery comprising the above described compound semiconductor.

Technical Solution

In order to achieve the objects, the present inventors, as the result of repeated studies on compound semiconductors, succeeded in synthesizing a compound semiconductor represented by the following Chemical Formula 1, confirmed that the compound can be used for thermoelectric conversion materials of thermoelectric conversion devices, photo absorbing layers of solar batteries, and the like, and completed the present invention.

Hereinafter, preferable examples of the present invention will be explained in detail. First, the terms or words used in the specification and claims should not be limitedly interpreted as common or dictionary meanings, but they should be interpreted as the meanings and concepts corresponding to the technical idea of the present invention, based on the principle that the inventors can appropriately define the concepts of terms so as to explained one's own invention in the best way.

Thus, the construction described in the examples of the specification are no more than most preferable example of the present invention, and they do not represent all the technical ideas of the present invention, and thus, it should be understood that various equivalents and modifications replacing the same can be made.

The present invention provides a novel compound semiconductor represented by the following Chemical Formula 1:

$$Pr_xS_yCo_4Sb_{12-z}Q_z$$ [Chemical Formula 1]

in the Chemical Formula 1, Q includes at least one of O, Se and Te, x, y, and z means the mole ratio of each element, wherein $0<x<1$, $0<y<1$, and $0<z<12$.

One or more kinds of elements selected from the group consisting of O, Se and Te mean O, Se, Te alone or combinations of two or more kinds thereof.

In the Chemical Formula 1, Pr is the symbol of element indicating a praseodymium element, S is the symbol of element indicating a sulfur element, Co is the symbol of element indicating a cobalt element, Sb is the symbol of element indicating an antimony element, Q means one or more kinds of elements elected from the group consisting of oxygen, selenium, and tellurium.

And, in the Chemical Formula 1, x is the relative mole ratio of the praseodymium(Pr) element, y is the relative mole ratio of the sulfur(S) element, and z is the relative mole ratio of one or more kinds of chalcogen elements selected from the group consisting of oxygen(O), selenium(Se), and tellurium(Te).

As explained, the compound semiconductor of the Chemical Formula 1 according to one embodiment of the present invention is Co—Sb based n-type skutterudite with chalcogen element Q being substituted at the antimony(Sb) site, in which the rare earth element Pr and chalcogen element S are co-filled as fillers.

Commonly, an n-type carrier in a compound semiconductor have an influence on the electrical properties, and in the compound semiconductor according to the present invention, $Q^{2-}$ is substituted at the Sb-site, and thus, the n-type carriers increase to improve the electrical properties, and due to the n-type carrier involved when filling Pr, the electrical properties may be further improved. Meanwhile, the lattice thermal conductivity of a compound semiconductor may decrease when voids existing in the skutterudite lattice are filled with a specific element to cause vibration, and thus, phonon scattering occurs, or a difference in the mass constituting the lattice is generated due to substitution, etc., and thus, phonon scattering occurs. In the case of the compound semiconductor according to the present invention, since Pr and S are respectively filled in the voids existing in the skutterudite lattice, lattice thermal conductivity may decrease, and particularly, since S involving a p-type carrier is preferentially and sufficiently filled, greater decrease effect of lattice thermal conductivity may be exhibited, and thereby, thermoelectric figure of merit may be improved. Thus, the limitation of the existing skutterudite thermoelectric material that is hard to handle and uses expensive rattler atoms may be overcome, and stable and high ZT value may be maintained at high temperature.

And, the effect obtained by the co-filling of Pr and S, and Sb substitution of chalcogen element Q may be further increased through the optimization of the contents in the semiconductor compound.

Specifically, in the Chemical Formula 1, Pr is an electron donor, and can optimize the output factor through carrier concentration tuning. Although rare earth elements such as Lanthanide series or Actinide series may be used in replacement of Pr, among various rare earth elements, Pr may be easily filled into the thermoelectric material, and if included in n-type skutterudite as a filler, may improve the electrical properties and decrease lattice thermal conductivity.

Such Pr may be included at the relative mole ratio x, specifically $0<x<1$, to the elements constituting the compound semiconductor of the Chemical Formula 1. If x is 1 or more, there is a concern that Pr may not be positioned in the voids inside the Co—Sb lattice, and a Pr—Sb based secondary phase such as PrSb or $PrSb_2$ may be formed, and thus, the lattice thermal conductivity of the compound semiconductor of the Chemical Formula 1 may rapidly increase and thermoelectric figure of merit may be deteriorated.

And, in the compound semiconductor of the Chemical Formula 1, since carrier concentration tuning through Pr filling is progressed after S is filled enough to completely lower the lattice thermal conductivity, due to the spatial limitation, the filled amount of Pr is relatively smaller than the content of S co-filled. Specifically, when the mole ratio of Pr in the compound semiconductor is x and the mole ratio is S is y, the ratio of x and y may be $x/y<1$, and considering the excellent improvement effect obtained by controlling the relative content ratio of Pr and S, more specifically, the ratio of x and y may be $0.1 \leq x/y \leq 0.9$, and even more specifically, $0.1 \leq x/y \leq 0.5$.

Considering the excellent improvement effect obtained by the Pr filling and content control, more specifically, Pr may be included in the compound semiconductor at the mole ratio of $0.01 \leq x < 0.2$, more specifically, $0.025 \leq x \leq 0.1$, while fulfilling the above described condition.

And, in the Chemical Formula 1, S is a filling element having high electronegativity, and forms a polar covalent bond with Sb and produces new vibration mode, thus functioning for lowering lattice thermal conductivity. Particularly, the lattice thermal conductivity decrease effect obtained by filling of S is remarkable, compared to the existing Sn filling. And, since S has high oxidation stability even at high temperature, it can improve durability in a thermoelectric module while minimizing process cost.

Such S may be included at the relative mole ratio y, specifically $0<y<1$, to the constructional elements constituting the compound semiconductor of the Chemical Formula 1. If y is greater than 1, there is a concern that S may not be positioned in the voids inside Co—Sb lattice, and a secondary phase may be formed, and thus, the thermoelectric conductivity of the compound semiconductor of the Chemical Formula 1 may rapidly increase, and thermoelectric figure of merit may decrease. Considering the excellent improvement effect obtained by S filling, more specifically, S may be included at the mole ratio of $0.1 \leq y \leq 0.5$, even more specifically, $0.1 \leq y \leq 0.2$.

Since the compound semiconductor of the Chemical Formula 1 according to one embodiment comprises Pr and S together, it has high oxidation stability even at high temperature, and thus, can improve durability in a thermoelectric module while minimizing process cost, and besides, the thermoelectric conductivity of the compound semiconductor of the Chemical Formula 1 may be remarkably decreased, thereby realizing improved thermoelectric performance.

However, if the filling amount of Pr and S in the compound semiconductor is excessively high, there is a concern that the excessive fillers may form a secondary phase, and thus, the total filling amount of Pr and S in the compound semiconductor may be $0<x+y\leq1$, more specifically, $0.01\leq x+y\leq0.5$, and even more specifically, $0.2\leq x+y\leq0.3$, under conditions fulfilling each content range. If the above conditions are fulfilled, there is no concern of formation of a secondary phase, and more excellent thermoelectric performance may be exhibited.

And, in the Chemical Formula 1, Q may increase the carrier concentration when substituted and introduced at the Sb site, thus improving the electrical properties of the compound semiconductor of the Chemical Formula 1. Specifically, Q may include a single element of O, Se or Te, or may include two or more kinds of them, and considering the excellent improvement effect, it may include a single element of Se or Te, and more specifically, Te.

Such Q may be included at the relative mole ratio z, specifically, $0<z<12$, to the constructional elements constituting the compound semiconductor of the Chemical Formula 1. If the mole ratio z of Q is 12 or more, there is a concern that a skutterudite phase with voids may not be formed, and if z is 0, the effect of improving the electrical properties of the compound semiconductor may not be obtained.

And, in the Chemical Formula 1, the content of Q may have an influence on the filling amounts of Pr and S, and in order to obtain sufficient lattice thermoelectric conductivity decrease effect resulting from the Q substitution together with the filling of Pr and S, it may be preferable that the filling amounts of Pr and S, and the substitution amount of Q are controlled together, under the above described content range conditions.

Specifically, the relationship between the relative mole ratio x of Pr, and the relative mole ratio z of chalcogen element Q may satisfy the requirement that the mole ratio of x to 1 mole of z is 0.01 to 0.5 moles, more specifically, 0.01 to 0.2 moles, even more specifically, 0.04 to 0.2 moles. That is, in the Chemical Formula 1, the chalcogen element Q may be included in an excessive amount, compared to Pr. If the mole ratio of x to 1 mole of z of the Chemical Formula 1 increases to greater than 0.5, the lattice thermal conductivity of the compound semiconductor of the Chemical Formula 1 may rapidly increase, and thus, thermoelectric performance may decrease. And, if the mole ratio of x to 1 mole of z of the Chemical Formula 1 decreases to less than 0.01, the content of Pr in the compound semiconductor of the Chemical Formula 1 may not be sufficient, and thus, it may be difficult to sufficiently realize the effect resulting from the addition of Pr.

Considering the excellent improvement effect obtained by controlling the content of Q element in consideration of the filling amounts of Pr and S, the Q element may be included in the compounds semiconductor in the content of $0.01\leq z\leq1$, more specifically, $0.5\leq z\leq0.8$, within the range fulfilling the above described conditions.

Meanwhile, in the compound semiconductor represented by the Chemical Formula 1, a secondary phase may be included, and the amount may vary according to the heat treatment conditions.

The compound semiconductor of the Chemical Formula according to one embodiment of the present invention may be prepared by mixing Pr, S, Co, and the element Q (Q includes at least one of O, Se and Te) in the contents fulfilling the compound composition of the following Chemical Formula 1, to prepare a mixture (step 1); and heat treating the mixture (step 2). Thus, according to another embodiment of the present invention, a method for preparing the above described compound semiconductor is provided.

Hereinafter, explaining each step in detail, the step 1 for preparing the compound semiconductor according to one embodiment of the present invention is a step of mixing constructional elements constituting the compound semiconductor.

The mixing may be conducted by a common method, except mixing each constructional element under the above described content ratio conditions.

And, the mixing may be conducted so as to fulfill the compound composition of the Chemical Formula 1.

In general, it is difficult to fill S alone when filling S for a compound semiconductor. And, the S filling of increases p-type carriers, and the Pr filling and Q substitution increase n-type carriers. Thus, in order to exhibit improved electrical properties as well as decreased lattice thermal conductivity, it is required to control the balance of the n-type carriers and p-type carriers in the compound semiconductor. Specifically, in the present invention, by using each raw material powder in the content fulfilling the requirement of $(x+z)>3y$, when the mole ratios of Pr, S and Q are designated as x, y, and z, respectively, S filling may be efficiently achieved, and the lattice thermal conductivity of the prepared compound semiconductor may be decreased and the electrical properties may be improved.

And, in the step of forming a mixture, each raw material to be mixed may be in the form of powder, but the present invention is not necessarily limited to the specific form of raw materials.

Next, the step 2 for preparing the compound semiconductor according to one embodiment of the present invention is a step of heat treating the mixture prepared in step 1.

The heat treatment may be conducted in the vacuum, or may be conducted while flowing inert gas such as Ar, He or $N_2$, that comprises hydrogen or does not comprise hydrogen.

Here, the heat treatment temperature may be 400° C. to 800° C. If the heat treatment temperature is less than 400° C., there is a concern that a semiconductor compound formation reaction may not be sufficiently occur, and if it is greater than 800', there is a concern of property deterioration of the semiconductor compound due to the generation of side-reactions. More specifically, the heat treatment temperature may be 450° C. to 700° C., more specifically 500° C. to 700° C.

Meanwhile, the heat treatment may be conducted in one step, or it may be conducted in multi-steps of two or more steps. For example, when the heat treatment is conducted in two steps, the mixture prepared in step 1 may be heat treated at a first temperature of 400° C. to 600° C., and then, heat treated at a second temperature of 600° C. to 800° C.

And, a part of the plural heat treatment steps may be conducted during the step of forming a mixture in which raw materials are mixed. For example, when the heat treatment is conducted in three steps, the first heat treatment step may be conducted at a temperature of 400° C. to 600° C., and the second and tertiary heat treatment steps may be conducted at a temperature of 600° C. to 800° C., wherein the first heat treatment step may be conducted during the step of forming a mixture where raw materials are mixed, and thereafter, the second and tertiary heat treatment steps may be sequentially conducted.

And, after the heat treatment step, in order to prevent the formation of a secondary phase, a step of cooling the heat treated mixture may be further conducted.

The cooling step is conducted by decreasing the temperature of the heat treated mixture to room temperature (about 20° C. to 30° C.), and various cooling methods or apparatuses previously known may be used without limitations.

And, for the heat treated mixture, or the mixture heat treated and then cooled, as necessary, a step of pressurized sintering may be optionally conducted so as to fill S and activate Te.

The specific method for progressing the pressurized sintering step is not specifically limited, but specifically, a hot press method or a spark plasma sintering(SPS) method may be used. More specifically, the pressurized sintering step may be conducted using a spark plasma sintering(SPS) method. The spark plasma sintering(SPS) is a sintering method of applying direct current pulse in a direction parallel to the pressurization direction while uniaxially pressurizing powder or plate, wherein pressure and low voltage high current are introduced into powder or plate, and the high energy of plasma that is instantly generated by the spark generated at this time is applied for electric diffusion or thermal diffusion, etc. Since such spark plasma sintering has lower sintering temperature, compared to the existing hot press method, and can complete sintering within a short time including temperature raising and maintaining times, power consumption may be largely reduced, handling is convenient, and running cost is inexpensive. And, any skills for sintering technology are not required, and it can be applied even for hardly sinterable material and materials that are difficult to process at high temperature.

And, the pressurized sintering step may be progressed at a temperature of 500° C. to 700° C. and a pressure of 20 MPa to 50 MPa for 10 to 60 minutes. If the sintering temperature is less than 500° C. or the sintering time is short and pressure is low, high density sintered body cannot be obtained. And, if the pressure is high, danger of applied mold and equipment may be caused.

And, before progressing the pressurized sintering step, a step of grinding the heated mixture or the mixture heat treated and then cooled, as necessary, may be further conducted. The grinding method is not specifically limited, and various grinding methods and apparatuses previously known may be applied without limitations.

The semiconductor compound prepared according to the above preparation method has low lattice thermal conductivity, and thus, exhibits improved thermal figure of merit, and has excellent electric conductivity. Thus, the compound semiconductor may replace the existing compound semiconductor or may be used as another material in addition to the existing compound semiconductor, and it may be applied for various uses such as thermoelectric conversion material of a thermoelectric conversion device, photo absorbing material of a solar battery, IR window selectively passing infrared ray or infrared sensor, a magnetic device, memory, etc.

Thus, according to another embodiment of the present invention, a thermoelectric conversion device comprising the compound semiconductor as thermoelectric conversion material is provided.

The thermoelectric conversion device is the same as common thermoelectric conversion device, except comprising the above compound semiconductor as thermoelectric conversion material, and the detailed explanations thereof are omitted.

According to still another embodiment of the present invention, a solar battery comprising the compound semiconductor is provided. The solar battery may comprise the compound semiconductor as material for forming a photo absorbing layer.

Specifically, a solar battery may be manufactured as a structure wherein a front transparent electrode, a buffer layer, a photo absorbing layer, a rear electrode, and a substrate, etc. are stacked sequentially from the side where sunlight enters. The substrate positioned at the lowest part may be made of glass, and the rear electrode formed thereon may be formed by depositing metal such as Mo, etc.

Subsequently, on the rear electrode, the compound semiconductor according to the present invention may be stacked by electron beam evaporation, sol-gel method, PLD(Pulsed Laser Deposition), etc., to form the photo absorbing layer. On the photo absorbing layer, a buffer layer that buffers a lattice constant difference and a band gap difference between a ZnO layer used for a front transparent electrode and the photo absorbing layer, may exist, and such a buffer layer may be formed by depositing material such as CdS, etc. by CBD(Chemical Bath Deposition), etc. Next, on the buffer layer, a front transparent electrode may be formed as a stacked film of ZnO or ZnO and ITO by sputtering, etc.

The solar battery according to the present invention may be variously modified. For example, a tandem solar battery wherein the solar battery using the compound semiconductor according to the present invention as a photo absorbing layer is stacked may be manufactured. And, as other solar batteries stacked together, solar batteries using silicon or other known compound semiconductors may be used.

And, by changing the band gap of the compound semiconductor of the present invention, plural solar batteries that use compound semiconductors with different band gaps as photo absorbing layers may be stacked. The band gap of the compound semiconductor according to the present invention may be controlled by changing the compositional ratio of the elements constituting the compound, particularly, Te.

And, the compound semiconductor according to the present invention may be applied for IR window that selectively passes infrared ray, or infrared sensor, etc.

Advantageous Effects

The compound semiconductor according to the present invention has low lattice thermal conductivity and thus exhibits improved thermoelectric figure of merit, and has excellent electric conductivity. Thus, the compound semiconductor may replace the existing compound semiconductor, or may be used as another material in addition to the existing compound semiconductor, and it may be applied for various uses such as thermoelectric conversion material of a thermoelectric conversion device, photo absorbing layer material of a solar battery, etc.

BRIEF DESCRIPTION OF DRAWINGS

FIG. 1 is a graph showing the evaluation results of lattice thermal conductivity($k_L$) of the compound semiconductors of Examples 1 to 4 (Ex. 1 to Ex. 4) and Comparative Example 1 to 3(Comp. Ex. 1 to Comp. Ex. 3).

FIG. 2 is a graph showing the evaluation results of thermoelectric figure of merit(ZT) of the thermoelectric devices comprising the compound semiconductors of Examples 1 to 4 (Ex. 1 to Ex. 4) and Comparative Examples 1 to 3(Comp. Ex. 1 to Comp. Ex. 3).

DETAILED DESCRIPTION OF THE EMBODIMENTS

The present invention will be explained in more detail in the following examples. However, these examples are presented only as the illustrations of the present invention, and the scope of the present invention is not limited thereby.

Example 1

In order to synthesize $Pr_{0.025}S_{0.2}Co_4Sb_{11.4}Te_{0.6}$, powder type Pr, S, Co, Sb and Te were weighed, and then, were put in an alumina mortar and mixed. The mixed materials were put in a carbide mold to make a pellet, and put in a fused silica tube and vacuum sealed. And, it was put in a box furnace and heated at 680° C. for 15 hours to obtain $Pr_{0.025}S_{0.2}Co_4Sb_{11.4}Te_{0.6}$. Thereafter, it was gradually cooled to room temperature, and filled in a graphite mold for spark plasma sintering, and then, spark plasma sintering was conducted at a temperature of 650° C. and a pressure of 50 MPa for 10 minutes. The relative density of the obtained compound semiconductor was measured to be 98% or more.

Example 2

A compound semiconductor was prepared by the same method as Example 1, except that the composition of the mixture was changed to $Pr_{0.05}S_{0.2}Co_4Sb_{11.4}Te_{0.6}$.

Example 3

A compound semiconductor was prepared by the same method as Example 1, except that the composition of the mixture was changed to $Pr_{0.075}S_{0.2}Co_4Sb_{11.4}Te_{0.6}$.

Example 4

A compound semiconductor was prepared by the same method as Example 1, except that the composition of the mixture was changed to $Pr_{0.1}S_{0.2}Co_4Sb_{11.4}Te_{0.6}$.

Comparative Example 1

A compound semiconductor was prepared by the same method as Example 1, except that Co, Sb and Te were prepared as reagents, and the composition of the mixture was changed to $Co_4Sb_{11.4}Te_{0.6}$.

Comparative Example 2

A compound semiconductor was prepared by the same method as Example 1, except that Pr, Co, Sb and Te were prepared as reagents, and the composition of the mixture was changed to $Pr_{0.05}Co_4Sb_{11.4}Te_{0.6}$.

Comparative Example 3

A compound semiconductor was prepared by the same method as Example 1, except that S, Co, Sb and Te were prepared as reagents, and the composition of the mixture was changed to $S_{0.2}Co_4Sb_{11.4}Te_{0.6}$.

Experimental Example 1: Measurement of Lattice Thermal Conductivity

The lattice thermal conductivities of the compound semiconductors obtained in Examples and Comparative Examples were measured, and the results were shown in FIG. 1.

Specifically, the compound semiconductors obtained in Examples and Comparative Examples were processed into coin-type of a diameter of 12.7 mm and a height of 1.5 mm to manufacture specimens. And, for the specimen, thermal conductivity was calculated from the measurement values of thermal diffusivity according to a laser flash method (Netzsch, LFA-457) in the range of 50° C. to 500° C., specific heat, and density, and then, a Lorenz number was calculated and the value was applied for the calculated thermal conductivity to obtain lattice thermal conductivity ($k_L$), and the results were shown in the following Table 1 and FIG. 1.

TABLE 1

| Temper- ature (°C.) | Lattice thermal conductivity(W/mK) | | | | | | |
|---|---|---|---|---|---|---|---|
| | Example | | | | Comparative Example | | |
| | 1 | 2 | 3 | 4 | 1 | 2 | 3 |
| 50 | 1.98 | 1.97 | 1.98 | 2.00 | 3.33 | 3.58 | 2.19 |
| 100 | 1.84 | 1.84 | 1.85 | 1.87 | 3.07 | 3.29 | 2.04 |
| 200 | 1.62 | 1.63 | 1.63 | 1.66 | 2.65 | 2.80 | 1.80 |
| 300 | 1.46 | 1.47 | 1.47 | 1.50 | 2.32 | 2.44 | 1.62 |
| 400 | 1.36 | 1.37 | 1.36 | 1.39 | 2.09 | 2.18 | 1.51 |
| 500 | 1.30 | 1.31 | 1.30 | 1.32 | 1.93 | 2.03 | 1.44 |

As the results of experiments, Examples 1 to 4 exhibited remarkably decreased lattice thermal conductivity over the whole temperature measurement sections, compared to Comparative Example 1 without filler, Comparative Example 2 wherein Pr was filled alone, and Comparative Example 3 wherein S was filled alone. Such results are due to the decrease in lattice thermal conductivity, as chalcogen element Q is substituted at the Sb position, and Pr and S are filled in an optimum content into Co—Sb based n-type skutterudite.

Experimental Example 2: Thermoelectric Figure of Merit(ZT)

The thermoelectric figures of merit of the compound semiconductors obtained in Examples and Comparative Examples were measured, and the results were shown in the following Table 2 and FIG. 2.

The compound semiconductors obtained in Examples and Comparative Examples were processed into rectangular-type with width 3 mm, length 3 mm, and height 12 mm to manufacture specimens. And, for the specimen, electric conductivity and Seebeck coefficient were measured using ZEM-3(Ulvac-Rico, Inc) in the range of 50° C. to 500° C.

And, using the measured electric conductivity, Seebeck coefficient, and the thermal conductivity of Experimental Example 1 explained above, thermoelectric figure of merit (ZT) was calculated through the following Mathematical Formula 1.

$$ZT = \sigma S^2 T/K \qquad \text{[Mathematical Formula 1]}$$

wherein, ZT denotes thermoelectric figure of merit, σ denotes electric conductivity, S denotes Seebeck coefficient, T denotes temperature, and K denotes thermal conductivity.

TABLE 2

| Temperature (° C.) | Thermoelectric figure of merit | | | | | | |
|---|---|---|---|---|---|---|---|
| | Example | | | | Comparative Example | | |
| | 1 | 2 | 3 | 4 | 1 | 2 | 3 |
| 50 | 0.26 | 0.26 | 0.27 | 0.26 | 0.18 | 0.17 | 0.25 |
| 100 | 0.36 | 0.36 | 0.36 | 0.35 | 0.25 | 0.23 | 0.34 |
| 200 | 0.57 | 0.57 | 0.59 | 0.57 | 0.40 | 0.39 | 0.54 |
| 300 | 0.81 | 0.80 | 0.84 | 0.81 | 0.58 | 0.57 | 0.76 |
| 400 | 1.04 | 1.04 | 1.08 | 1.04 | 0.76 | 0.76 | 0.98 |
| 500 | 1.24 | 1.25 | 1.27 | 1.24 | 0.93 | 0.92 | 1.18 |

As the results of experiments, as shown in FIG. 2, the compound semiconductors of Examples 1 to 4 exhibited high thermoelectric figures of merit over the whole temperature measurement sections, compared to Comparative Example 1 to 3, due to lowered lattice thermal conductivity.

The invention claimed is:

1. A compound semiconductor represented by the following Chemical Formula 1:

$$Pr_xS_yCo_4Sb_{12-z}Q_z \qquad \text{Chemical Formula 1}$$

In the Chemical Formula 1, Q includes at least one of O, Se and Te, x, y, and z means the mole ratio of each element, wherein $0<x<1$, $0<y<1$, and $0<z<12$.

2. The compound semiconductor according to claim 1, wherein in the Chemical Formula 1, x and y fulfill $x/y<1$.

3. The compound semiconductor according to claim 1, wherein in the Chemical Formula 1, x and y fulfill $0<x+y\le1$.

4. The compound semiconductor according to claim 1, wherein in the Chemical Formula 1, the mole ratio of x to 1 mole of z is 0.01 to 0.5 moles.

5. The compound semiconductor according to claim 1, wherein in the Chemical Formula 1, $0.01\le x<0.2$, $0.1\le y\le0.5$, and $0.01\le z\le1$.

6. The compound semiconductor according to claim 1, wherein in the Chemical Formula 1, Q is Te.

7. A method for preparing a compound semiconductor of claim 1, comprising the steps of:

mixing Pr, S, Co, Sb, and the element Q (Q includes at least one of O, Se and Te) in the contents fulfilling the compound composition of the following Chemical Formula 1, to prepare a mixture; and heat treating the mixture:

$$Pr_xS_yCo_4Sb_{12-z}Q_z \qquad \text{Chemical Formula 1}$$

in the Chemical Formula 1, Q includes at least one of O, Se and Te, x, y, and z means the mole ratio of each element, wherein $0<x<1$, $0<y<1$, and $0<z<12$.

8. The method according to claim 7, wherein the heat treatment step is conducted at 400° C. to 800° C.

9. The method according to claim 7, further comprising a step of cooling, after the heat treatment step.

10. The method according to claim 7, further comprising a step of pressurized sintering, after the heat treatment step.

11. A thermoelectric conversion device comprising the compound semiconductor according to claim 1.

12. A solar battery comprising the compound semiconductor according to claim 1.

* * * * *